(12) United States Patent
Sprouse et al.

(10) Patent No.: US 9,092,340 B2
(45) Date of Patent: Jul. 28, 2015

(54) METHOD AND SYSTEM FOR ACHIEVING DIE PARALLELISM THROUGH BLOCK INTERLEAVING

(75) Inventors: Steven Sprouse, San Jose, CA (US); Chris Avila, Sunnyvale, CA (US); Jianmin Huang, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 592 days.

(21) Appl. No.: 12/642,181

(22) Filed: Dec. 18, 2009

(65) Prior Publication Data

US 2011/0153911 A1   Jun. 23, 2011

(51) Int. Cl.
| G06F 12/02 | (2006.01) |
| G06F 12/08 | (2006.01) |
| G11C 7/10 | (2006.01) |
| G11C 11/56 | (2006.01) |

(52) U.S. Cl.
CPC ........ *G06F 12/0851* (2013.01); *G06F 12/0246* (2013.01); *G11C 7/1042* (2013.01); *G11C 11/5628* (2013.01); *G06F 2212/2022* (2013.01); *G06F 2212/222* (2013.01); *G06F 2212/284* (2013.01); *G06F 2212/313* (2013.01); *G06F 2212/7203* (2013.01); *G06F 2212/7208* (2013.01)

(58) Field of Classification Search
None
See application file for complete search history.

(56) References Cited

U.S. PATENT DOCUMENTS

| 5,519,847 A * | 5/1996 | Fandrich et al. ............ 711/169 |
| 5,572,466 A * | 11/1996 | Sukegawa ............... 365/185.33 |
| 5,930,167 A * | 7/1999 | Lee et al. ............... 365/185.03 |
| 7,636,808 B2 * | 12/2009 | Akiyama et al. .............. 711/5 |
| 2005/0251617 A1 | 11/2005 | Sinclair et al. |
| 2005/0286855 A1 * | 12/2005 | Saitou et al. ............... 386/46 |
| 2006/0233026 A1 * | 10/2006 | Li ........................ 365/189.05 |
| 2007/0288688 A1 * | 12/2007 | Kang ...................... 711/103 |
| 2008/0034153 A1 * | 2/2008 | Lee et al. .................. 711/103 |
| 2008/0082730 A1 * | 4/2008 | Kim et al. ................. 711/103 |
| 2008/0189478 A1 * | 8/2008 | Chae et al. ................ 711/103 |
| 2008/0250195 A1 * | 10/2008 | Chow et al. ............... 711/103 |
| 2009/0144501 A2 * | 6/2009 | Yim et al. ................. 711/120 |
| 2009/0248952 A1 * | 10/2009 | Radke et al. .............. 711/100 |

(Continued)

FOREIGN PATENT DOCUMENTS

WO    2007/081638 A2    7/2007

OTHER PUBLICATIONS

Chanik Park et al. "A High Performance Controller for NAND Flash-based Solid State Disk (NSSD)." Feb. 2006. IEEE. NVSMW 2006.*

(Continued)

*Primary Examiner* — Nathan Sadler
(74) *Attorney, Agent, or Firm* — Brinks Gilson & Lione

(57) ABSTRACT

A method and system for achieving die parallelism through block interleaving includes non-volatile memory having a multiple non-volatile memory dies, where each die has a cache storage area and a main storage area. A controller is configured to receive data and write sequentially addressed data to the cache storage area of a first die. The controller, after writing sequentially addressed data to the cache storage area of the first die equal to a block of the main storage area of the first die, writes additional data to a cache storage area of a next die until sequentially addressed data is written into the cache area of the next die equal to a block of the main storage area. The cache storage area may be copied to the main storage area on the first die while the cache storage area is written to on the next die.

24 Claims, 15 Drawing Sheets

(56) References Cited

U.S. PATENT DOCUMENTS

| | | | |
|---|---|---|---|
| 2009/0300269 A1* | 12/2009 | Radke et al. | 711/103 |
| 2010/0057979 A1* | 3/2010 | Chu et al. | 711/103 |
| 2010/0172179 A1* | 7/2010 | Gorobets et al. | 365/185.09 |
| 2010/0199025 A1* | 8/2010 | Nanjou et al. | 711/103 |
| 2010/0325342 A1* | 12/2010 | Honda | 711/103 |
| 2011/0019475 A1* | 1/2011 | Moshayedi | 365/185.11 |
| 2011/0138100 A1* | 6/2011 | Sinclair | 711/5 |
| 2014/0022842 A1* | 1/2014 | Jung et al. | 365/185.03 |

OTHER PUBLICATIONS

Jeong-Uk Kang et al. "A Multi-Channel Architecture for High-Performance NAND Flash-Based Storage System." Feb. 2007. Elsevier. Journal of Systems Architecture. vol. 53. 644-658.*

Soojun Im et al. "Storage Architecture and Software Support for SLC/MLC Combined Flash Memory." Mar. 2009. ACM. SAC'09.*

Chang, Li-Pin: "Efficient Management for Large-Scale Flash Memory Storage Systems With Resource Conservation", National Chiao-Tung University, Hsin-Chu, Taiwan, Nov. 2005, 37 pages.

Lee, Yong-Goo et al.: "µ-FTL: A Memory-Efficient Flash Translation Layer Supporting Multiple Mapping Granularities", Korean Advanced Institute of Science and Technology, 2008, 10 pages.

U.S. Appl. No. 12/260,135, filed Oct. 29, 2008, "Method and Apparatus for Enforcing a Flash Memory Caching Policy", Inventors: Menahem Lasser, Izhak Afriat, Opher Lieber, 59 pages.

* cited by examiner

METHOD AND SYSTEM FOR ACHIEVING DIE PARALLELISM THROUGH BLOCK INTERLEAVING

TECHNICAL FIELD

This application relates generally to managing data in a memory system. More specifically, this application relates to the operation of a memory system to improve die parallelism in re-programmable non-volatile semiconductor flash memory having multiple die.

BACKGROUND

When writing data to a conventional flash data memory system, a host typically assigns unique logical addresses to sectors, clusters or other units of data within a continuous virtual address space of the memory system. The host writes data to, and reads data from, addresses within the logical address space of the memory system. The memory system then commonly maps data between the logical address space and the physical blocks of the memory. Each block consists of a number of pages.

A common practice with flash memory is to operate multiple memory die in parallel to increase write performance. One method for achieving the multiple die parallelism is known as page level die interleaving, where one page is written to each of the different die in the memory system before writing a next page to each die. In this technique, sequentially addressed data that is written from the host to the memory system is striped across multiple die a page at a time. The write performance of a multiple die flash memory may be improved using this technique, but the size of the resulting metablock tends to be large. Larger metablock sizes can degrade the performance of a memory system when the memory system receives random writes, rather than long sequential writes, from a host.

BRIEF SUMMARY

In order to address the need for improved memory management in a multi-bank memory system, methods and systems are disclosed herein for achieving memory die parallelism at block level.

According to one aspect, a memory system includes a non-volatile memory having a plurality of non-volatile memory dies, wherein each of the plurality of non-volatile memory dies has a cache storage area and a main storage area. The memory includes a controller configured to receive data, where the received data is associated with host logical block addresses. The controller is further configured to write sequentially addressed data to the cache storage area of a first die of the plurality of non-volatile memory dies and, after writing an amount of sequentially addressed data to the cache storage area of the first die equal to a block of the main storage area of the first die, to write additional received sequentially addressed data to a cache storage area of a next die of the plurality of dies until a second amount of sequentially addressed data is written into the cache area of the next die equal to a block of the main storage area of the next die. The data received may be data from an external host as a result of a host write operation or from an internal source in the memory system as a result of a housekeeping operation in the memory system.

In another aspect of the invention, a method of operating a non-volatile memory system is disclosed, where the non-volatile memory system includes a non-volatile memory with a controller and a plurality of non-volatile memory dies, each of the plurality of non-volatile memory dies having a cache storage area and a main storage area. In the method, the controller receives data associated with host logical block addresses. The controller writes sequentially addressed data to the cache storage area of a first die of the plurality of non-volatile memory dies. After writing an amount of sequentially addressed data to the cache storage area of the first die equal to a block of the main storage area of the first die, the controller writes additional received sequentially addressed data to a cache storage area of a next die of the plurality of dies until a second amount of sequentially addressed data is written into the cache area of the next die equal to a block of the main storage area of the next die. The controller may write data from the cache storage area to the main storage area of the first die while writing additional received data to the cache area of the next die. Alternatively, the controller may write data from the cache storage area to the main storage area of the first die while writing data from the cache storage area to the main storage area of the next die.

Other features and advantages will become apparent upon review of the following drawings, detailed description and claims. Additionally, other embodiments are disclosed, and each of the embodiments can be used alone or together in combination. The embodiments will now be described with reference to the attached drawings.

DETAILED DESCRIPTION

A flash memory system suitable for use in implementing aspects of the invention is shown in FIGS. 1-7. A host system 100 of FIG. 1 stores data into and retrieves data from a memory system 102. The memory system may be flash memory embedded within the host, such as in the form of a solid state disk (SSD) drive installed in a personal computer.

Figure 1:
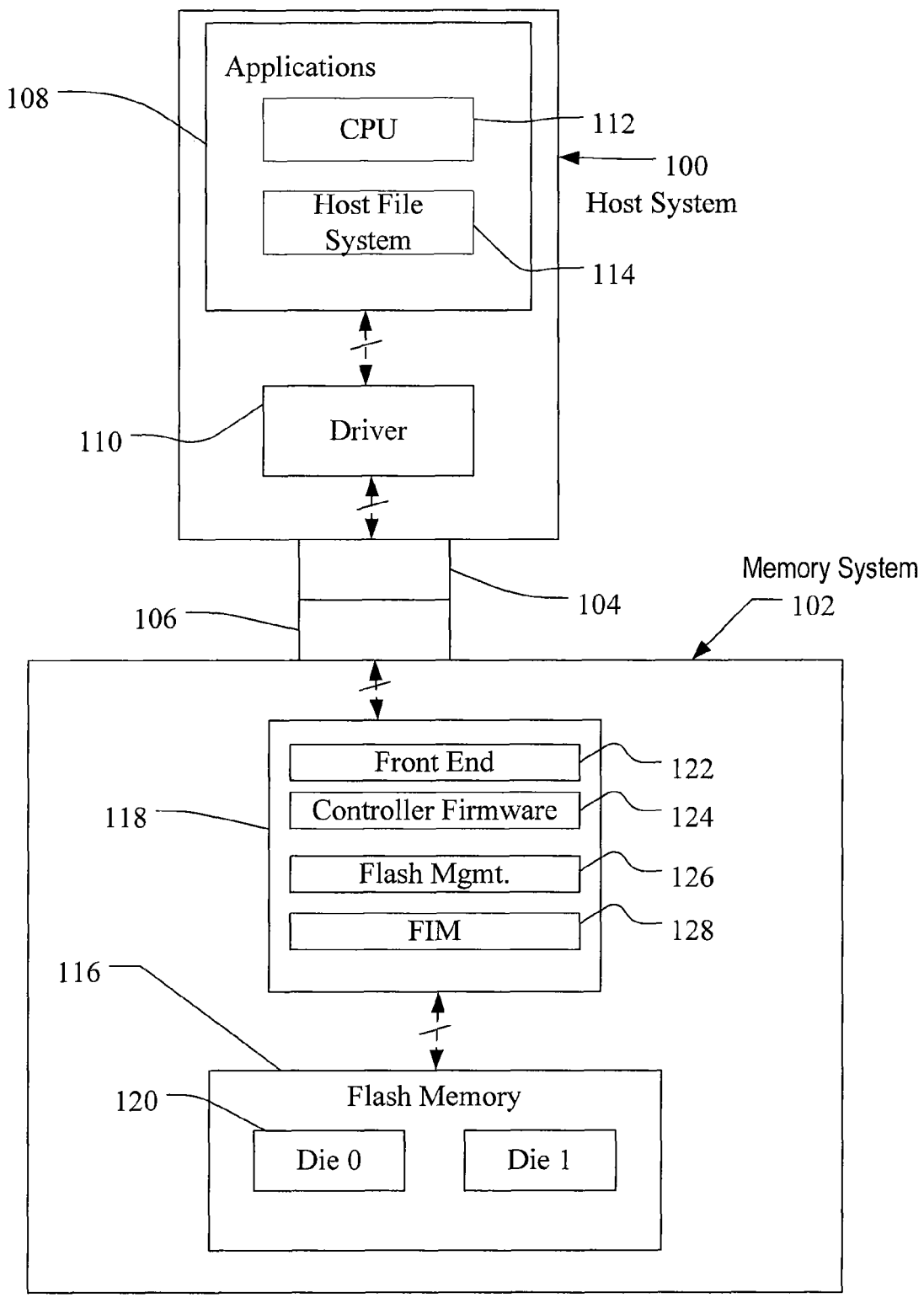
FIG. 1 illustrates a host connected with a memory system having a multi-bank non-volatile memory containing multiple die.

Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

The host system 100 of FIG. 1 may be viewed as having two major parts, insofar as the memory system 102 is concerned, made up of a combination of circuitry and software. They are an applications portion 108 and a driver portion 110 that interfaces with the memory system 102. In a PC, for example, the applications portion 110 can include a processor 112 running word processing, graphics, control or other popular application software, as well as the file system 114 for managing data on the host 100. In a camera, cellular telephone or other host system that is primarily dedicated to performing a single set of functions, the applications portion 108 includes the software that operates the camera to take and store pictures, the cellular telephone to make and receive calls, and the like.

The memory system 102 of FIG. 1 may include non-volatile memory, such as flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. The flash memory 116 may include any number of memory die 120 and two memory die are shown in FIG. 1 simply by way of illustration. Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
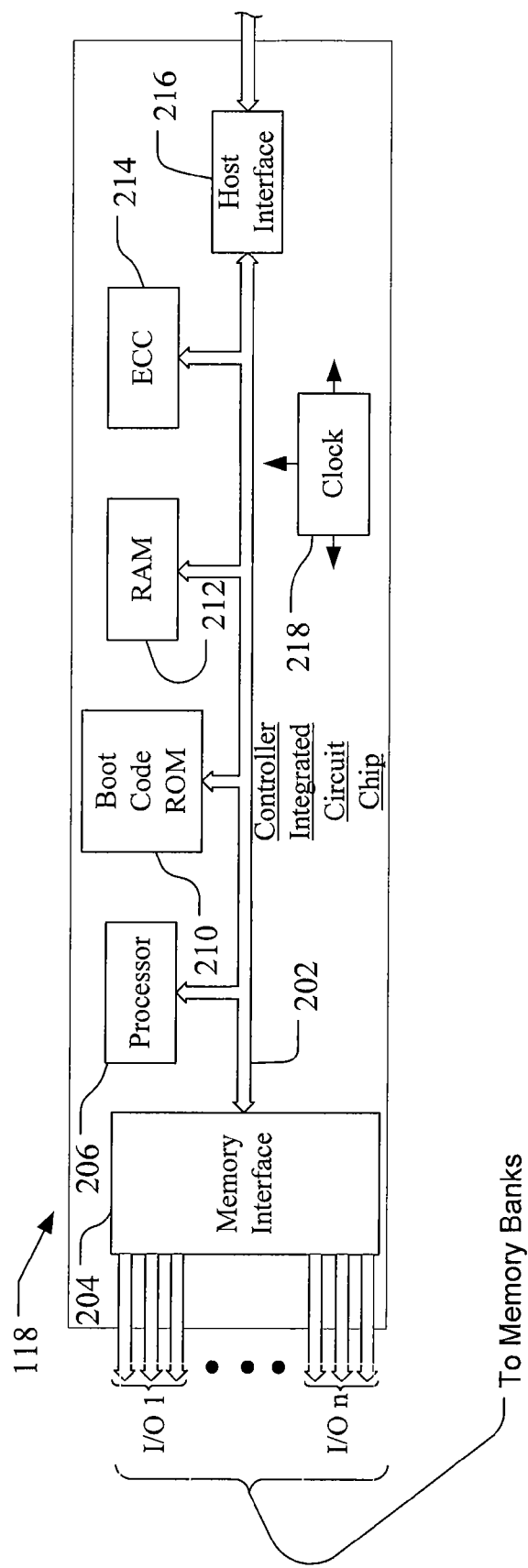
FIG. 2 is an example block diagram of an example flash memory system controller for use in the multiple die non-volatile memory of FIG. 1.

The system controller 118 and may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
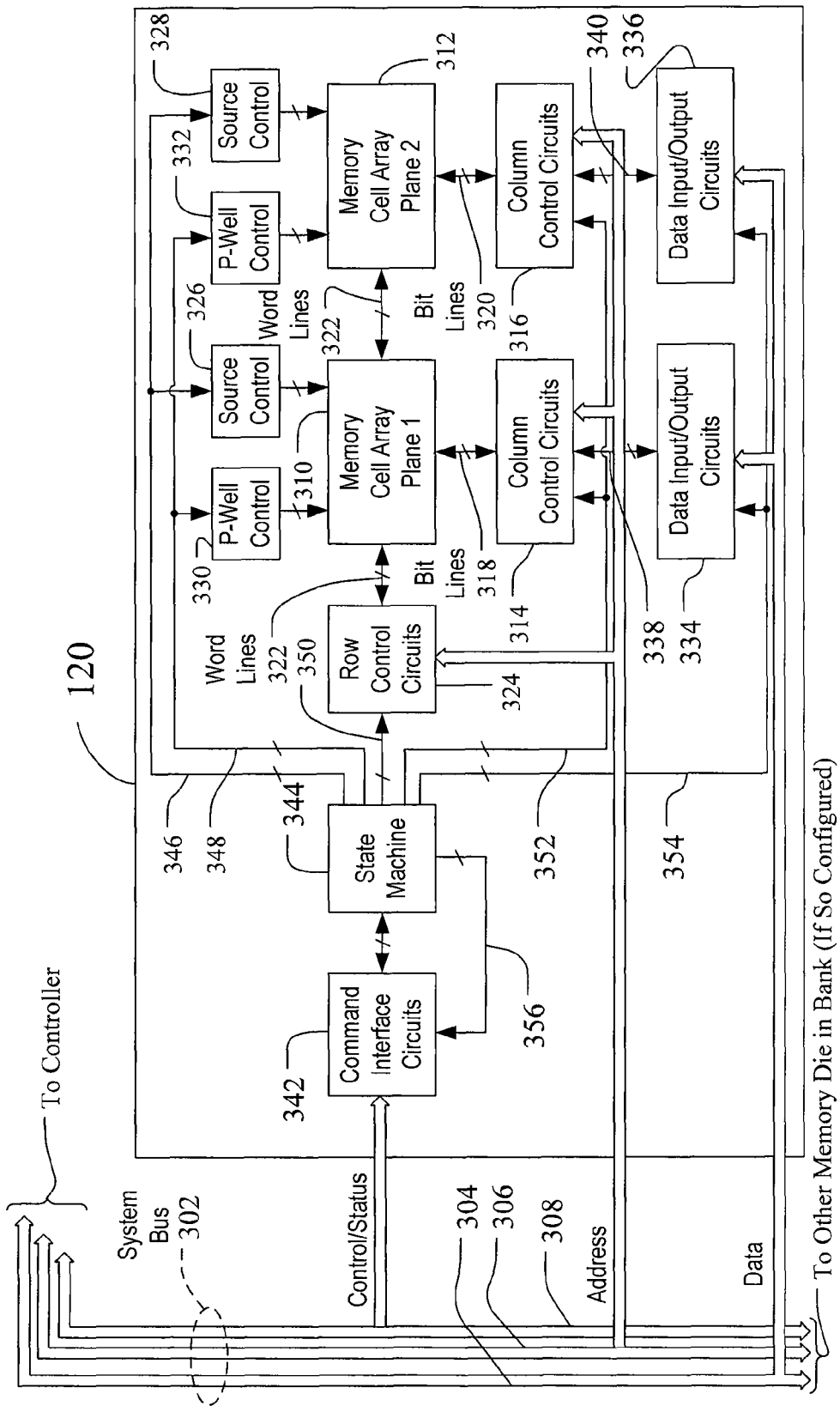
FIG. 3 is an example one flash memory bank suitable as one of the non-volatile memory banks illustrated in FIG. 1.

Each die 120 in the flash memory 116 may contain an array of memory cells organized into multiple planes. One of FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 306. Source voltage control circuits 326 and 328 are also connected with the respective planes, as are p-well voltage control circuits 330 and 332. If the bank 120 is in the form of a memory chip with a single array of memory cells, and if two or more such chips exist in the system, data is transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
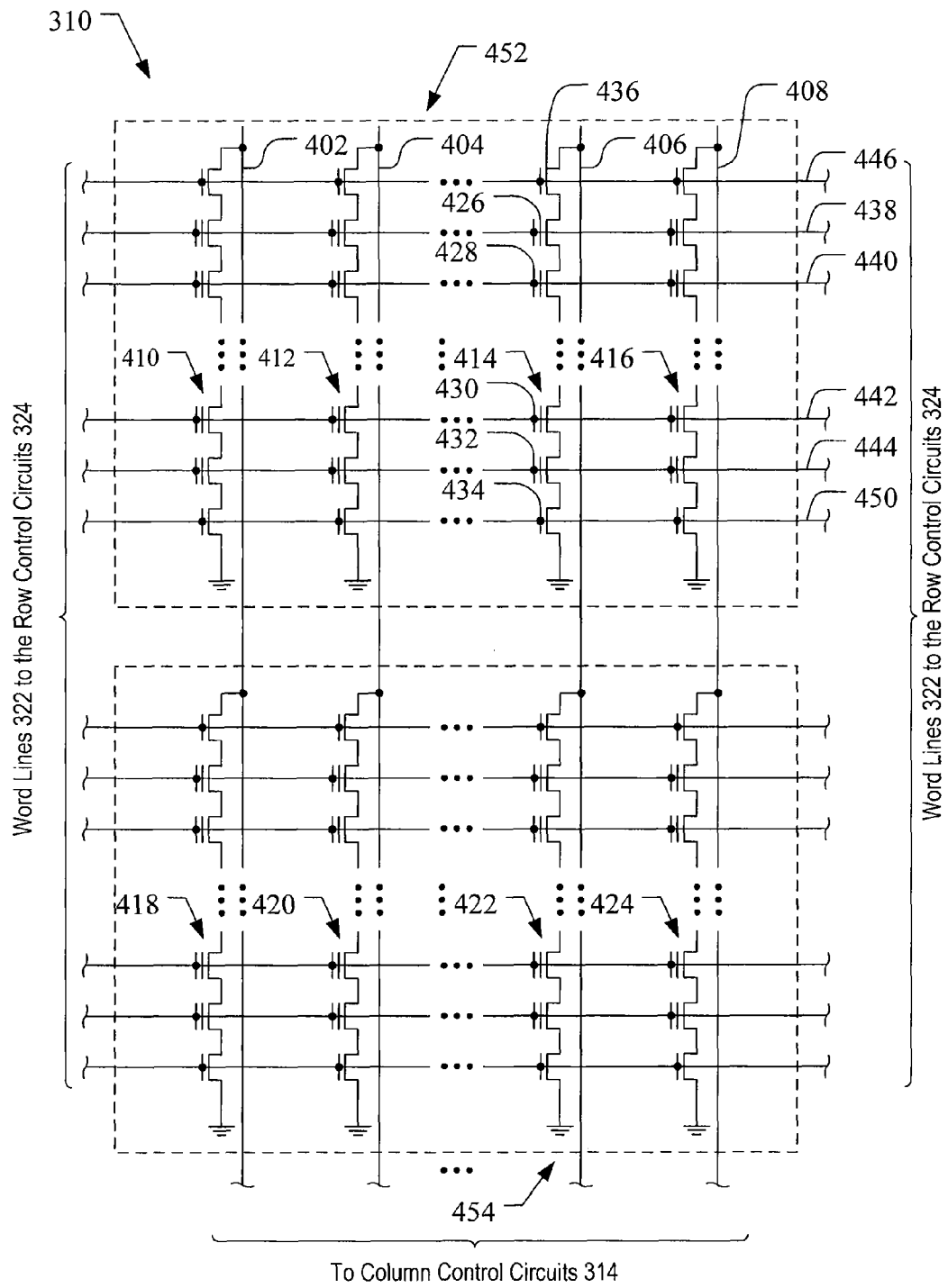
FIG. 4 is a representative circuit diagram of a memory cell array that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material.

Figure 5:
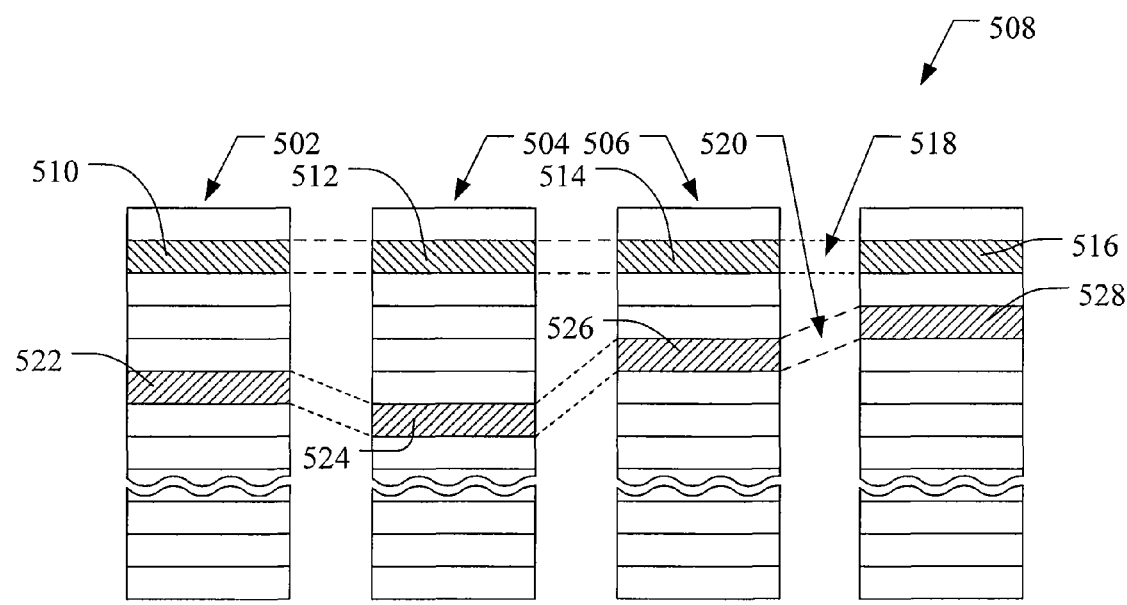
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
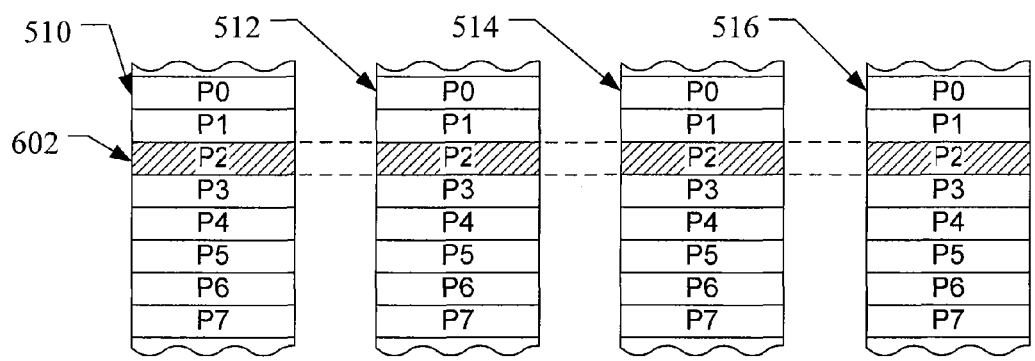
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a die, a metapage is the maximum unit of programming.

Figure 7:
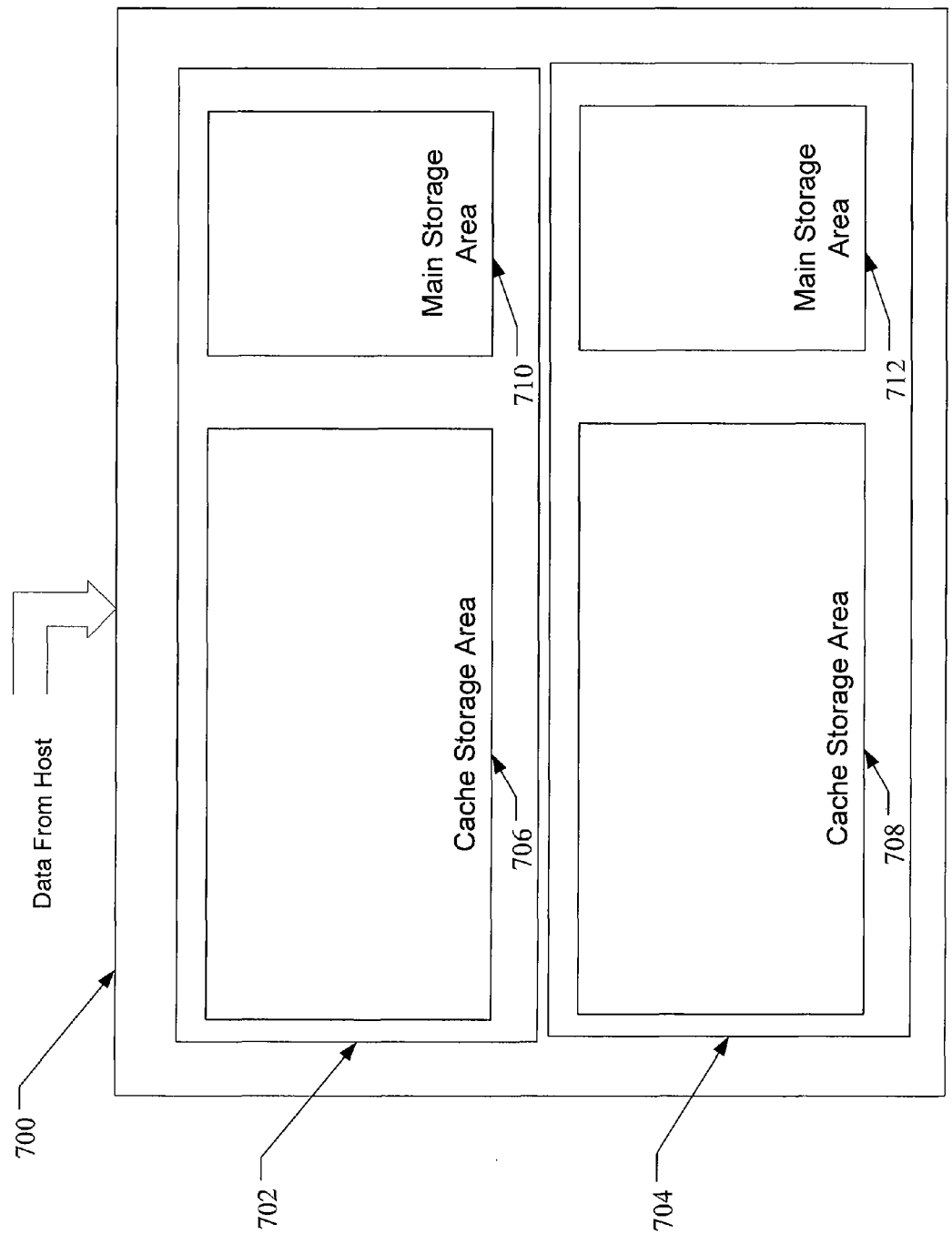
FIG. 7 illustrates a two die memory system.
Figure 8:
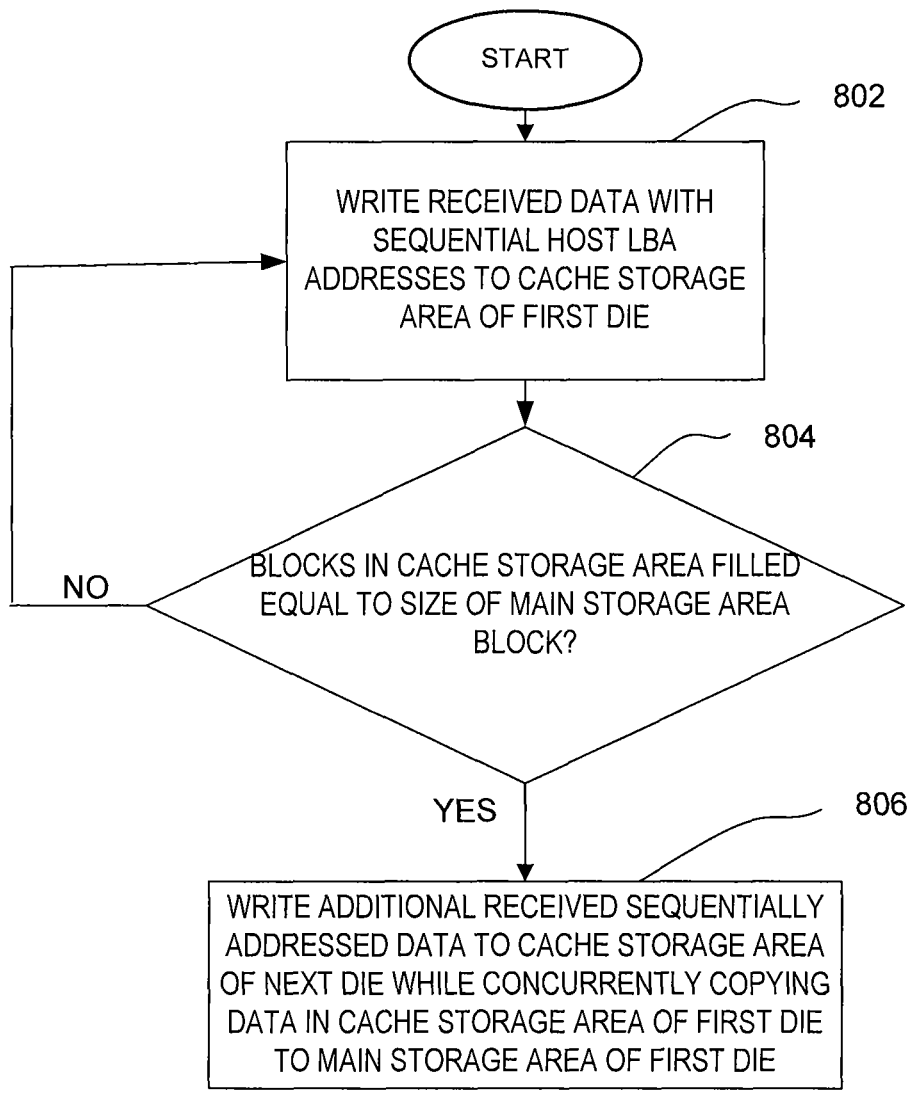
FIG. 8 is a flow diagram of a method of achieving die parallelism in a memory system such as shown in FIG. 7.

FIG. 7 illustrates a memory 700 with two memory die 702, 704 each having a cache storage area 706, 708 and a main storage area 710, 712 arrangement that may be used to implement block interleaving. As shown in FIG. 8, block interleaving between multiple die such as die 702 and 704 in a flash memory 700 may be accomplished by writing sequentially addressed data received from a host to the cache storage area 706 of a first die 702 in flash memory (at 802). When an amount of sequentially addressed data has been written to the cache storage area 706 of the first die that is equal to a size of a block of memory in a main storage area 710 of the first die, the controller of the flash memory writes a next group of received data from the host that is sequentially addressed to cache storage blocks in the next memory die 704 of the flash memory (at 804, 806). The writing of sequentially addressed data into the cache storage area 702 of the second die 704 continues until, as with the first die 702, an amount of the cache storage area 708 of the second die 704 equal to a block size of a block in the main storage area 712 of the second die 704 is filled. In one embodiment, the sequentially addressed data in the cache storage area 706 of the first die 702 is written to main storage area 710 of the first die 702 concurrently with the writing of sequentially addressed data from the host to the cache storage area 708 of the second die 704 (at 806). Accordingly, an entire block in the main storage area of each die is populated with sequentially addressed data each time data is copied from the cache storage area 706, 708 to the main storage area 710, 712.

For simplicity of illustration, a controller is not shown in FIG. 7, however the memory 700 of FIG. 7 may associated with a discrete controller such as controller 118 shown in FIG. 2, may have one or more controllers integrated with the memory die on a single chip or may be configured to work with a combination of the two.

The steps illustrated in FIG. 8 assume a size of blocks in the cache storage area that is smaller than a size of blocks in the main storage area for each die of the flash memory. Also, the process described in FIG. 8 may be applied to any number of planes per die, where each plane in a die has cache and main storage areas, by writing to a number of blocks in the cache storage area of each respective plane in a die equal to the respective block size in the main storage area of each plane. Thus each of the cache storage areas for each plane of a die would be first written to prior to writing to the cache storage area of each plane in a next die. Also, the cache storage area for each plane on the first die may be concurrently copied to the respective main storage area for the planes on the first die while host data is being written to cache storage area of each plane on the second die. Accordingly, the approach to block interleaving is scalable to any number of planes per die.

A more detailed example of one implementation of the process illustrated in FIG. 8 is shown in FIGS. 9A-9D. In the example of FIGS. 9A-9D a flash memory 900 is shown having two die, each with a single plane. In this example, the cache storage area is made up of binary (SLC) memory cells organized in blocks that contain 64 pages totaling 1 Megabyte of data and the main storage area in each die is made up of MLC memory cells (3 bits per cell in this example) organized in blocks that contain 3 Megabytes of data. Therefore, three binary blocks form an update group for each MLC block. Other size combinations of binary and MLC blocks may be implemented in different embodiments. Additionally, memory die with more than one plane per die may also be adapted in other embodiments.

Figure 9A:
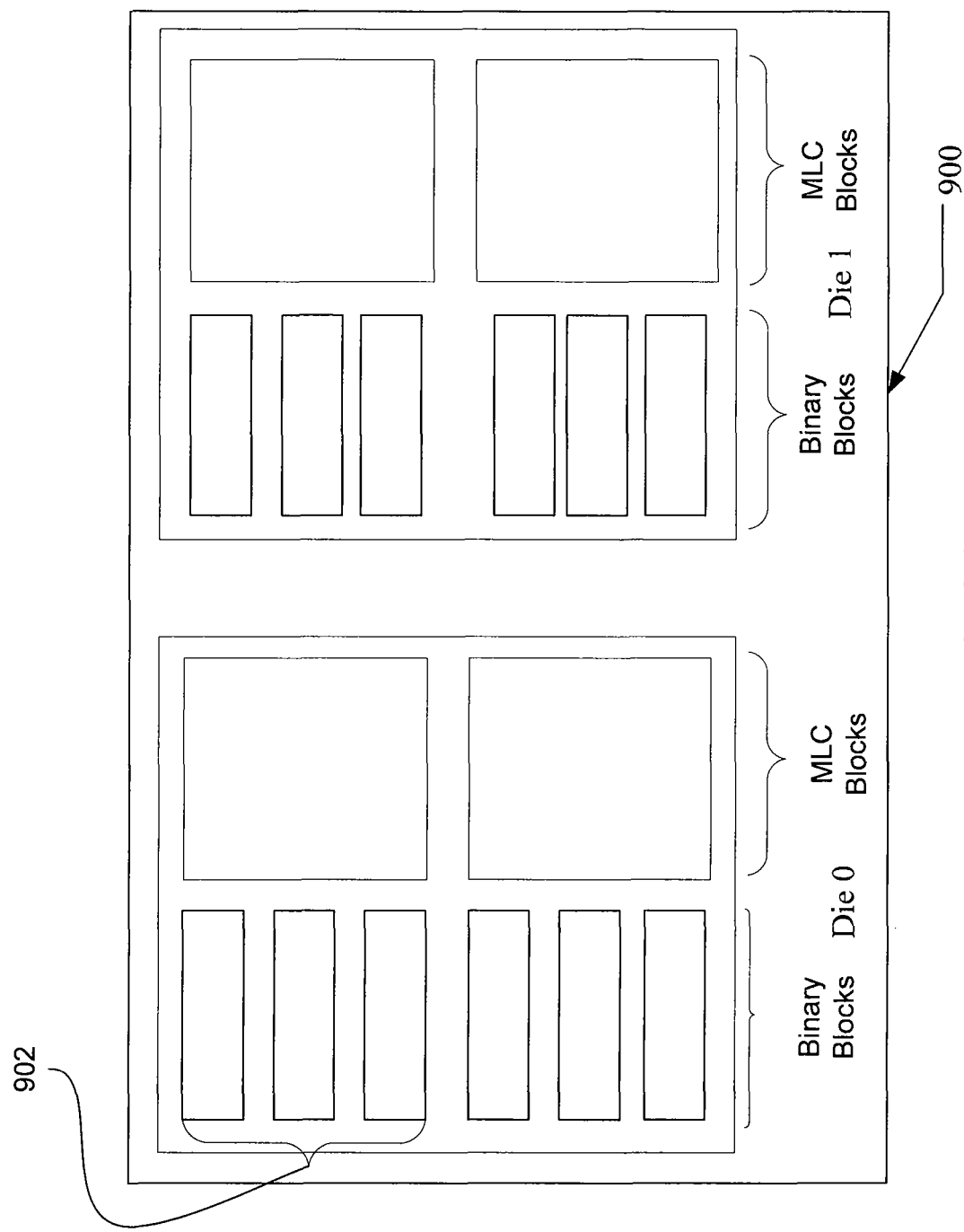
FIGS. 9A-9D illustrates an embodiment of sequential write and parallel fold operations in a multiple die memory.
Figure 9B:
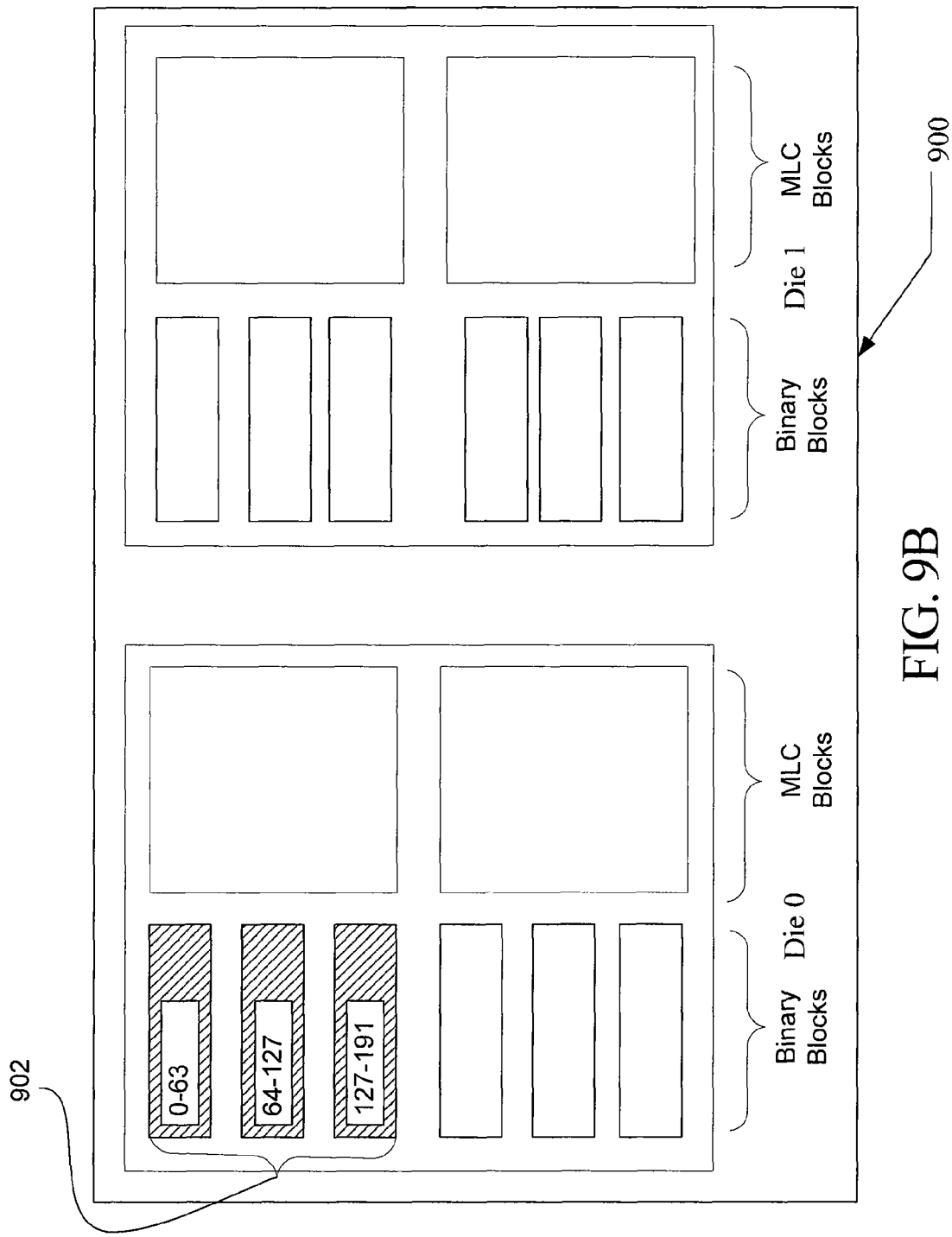
Figure 9C:
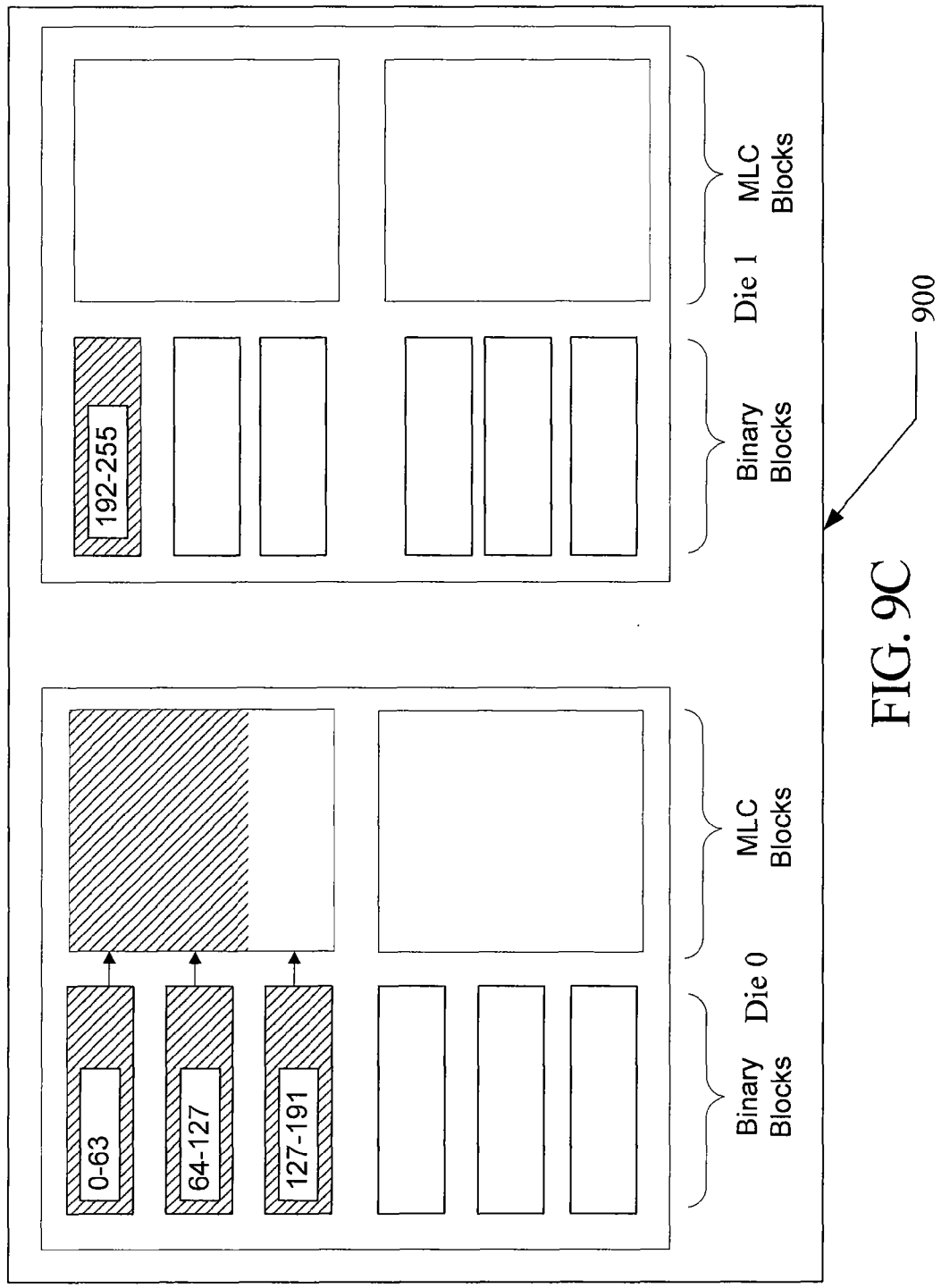

FIG. 9A illustrates the start of a sequential write operation in a flash memory 900 made up of two die, each die having a single plane arrangement of memory cells. For purposes of illustration, the sequence of FIGS. 9A-9D is discussed with respect to data received from an external host, however the same process of sequentially writing to binary and then folding into MLC applies to data received from a source internal to the memory system (such as the binary cache). At the beginning of the sequential write operation, two empty MLC update blocks and 12 empty binary (SLC) update blocks are available, where half of each type of block are on each die. As data is written from the host, it is first written to the binary update blocks in Die 0. Sequentially addressed host data is written to the binary update blocks in Die 0 until the entire update group of three binary blocks, also referred to as a virtual update block 902, is completely filled. This state is shown in FIG. 9B, where data for consecutive host LBA addresses 0-63, 64-127 and 127-191 have filled up three binary blocks. At this point, the controller of the flash memory 900 directs the next group of sequentially addressed host data to the first of the binary blocks in an update group in the binary cache of Die 1. As illustrated in FIG. 9C, concurrently with writing the next group of sequentially addressed host data to the binary cache in Die 1, data in the completed binary block update group in Die 0 is copied to the associated MLC block in Die 0. As described in greater detail below, the copy step from binary to MLC within a die is an on-chip copy process referred to herein as folding. More detail on folding is described below.

Figure 9D:
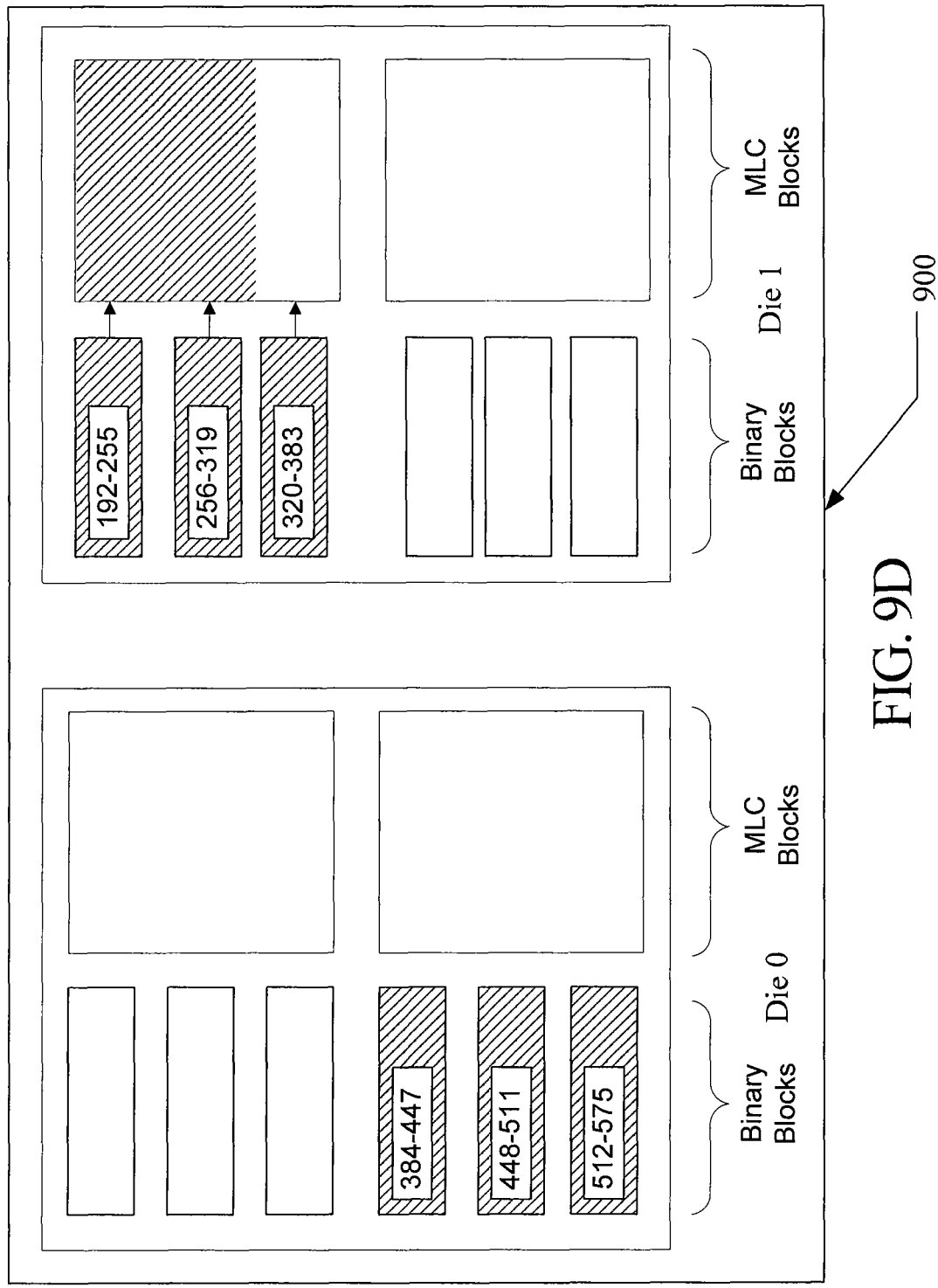

Referring to FIG. 9D, after completing the internal folding operation to copy the data from the first binary update group to the first MLC update block in Die 0, the controller will direct sequentially addressed data from the host to the second update group of binary blocks in Die 0 while completing the folding process from binary to MLC in the first update group in Die 1. Also, after the folding process is completed on the first update group in Die 0, the binary blocks in the first update group may be erased and returned to a pool of unallocated blocks. In one implementation, the number of pages written to binary blocks should equal the number of pages folded into MLC blocks, therefore the controller should write 3 metapages to binary update blocks for every folding step of copying each completed binary update block from an update group into a corresponding MLC block.

When gathering the necessary sequentially addressed host data in a virtual update block 902 of three binary blocks for folding into one 3 bit-per-cell MLC block, the logical group of addresses may be predetermined. Thus, the logical group to be associated with each virtual update block 902 grouped with an MLC block has a known starting address such as address 0 for the first group of update blocks of Die 0 in FIG. 9B. Alternatively, rather than a fixed mapping where each virtual update block is assigned to a predetermined address range, a non-fixed mapping of addresses to the binary blocks may be implemented. In this non-fixed mapping implementation, the three binary blocks making up a virtual update block may be assigned sequentially addressed data, regardless of the starting address of the data, as long as sequentially addressed data is contained in the three binary blocks.

In another embodiment, the method may include filling up two or more virtual update blocks in each die before proceeding to write data to virtual update blocks of a next die. Thus, referring to the binary block triplets that define virtual update blocks 902 in FIGS. 9A-9D, more than one virtual update block 902 may be filled up before writing to virtual update blocks 902 in the next die.

The folding process of performing an on-chip copy of data from three binary blocks to one MLC block in the example above may be accomplished using a "foggy-fine" technique to transfer the data from the 1 bit (2 states) per cell memory cells of the binary blocks to the higher density 3 bit (8 states) per cell arrangement of the MLC block. As is generally understood, binary flash memory cells can have two possible states (0 or 1) that represent 1 bit of information. For a given total operating voltage range available in a cell, the states of a binary cell can be represented by voltage levels above or below a reference voltage set halfway between the maximum and minimum voltage of the range. MLC memory cells, which may have the same physical configuration as a binary cell, need to partition their operating voltage range into finer increments to allow for discernable peaks at each desired state. For a three bit per cell MLC arrangement, a distribution of detectable eight states (000, 001, 010, 011, 100, 101, 110, 111) must be fit into the same voltage range that the binary memory cell can use for just two states.

In order to accurately copy data from the three binary update blocks to the associated MLC block after the update blocks have been written to, a binary to MLC write process such as the foggy-fine process described below is used. The process of writing from the three binary blocks to the one denser MLC block requires repeated writes to each wordline of the MLC block in order to achieve the charge resolution in the MLC cells necessary to distinguish between the greater possible states in the MLC cells. Referring to the foggy-fine folding process 1000 illustrated in FIG. 10 for the binary to 3 bit MLC example that has been discussed above, the memory controller writes to each wordline (WL) 1002 of the MLC three times. The first programming pass for the wordline 1002 is referred to as a lower resolution programming pass 1004. The second programming pass for the wordline is referred to as the foggy programming pass 1006 and the third and final programming pass is the fine programming pass 1008. Although each wordline 1002 will be written to three times, the order of the writing may be interleaved among the wordlines.

Figure 10:
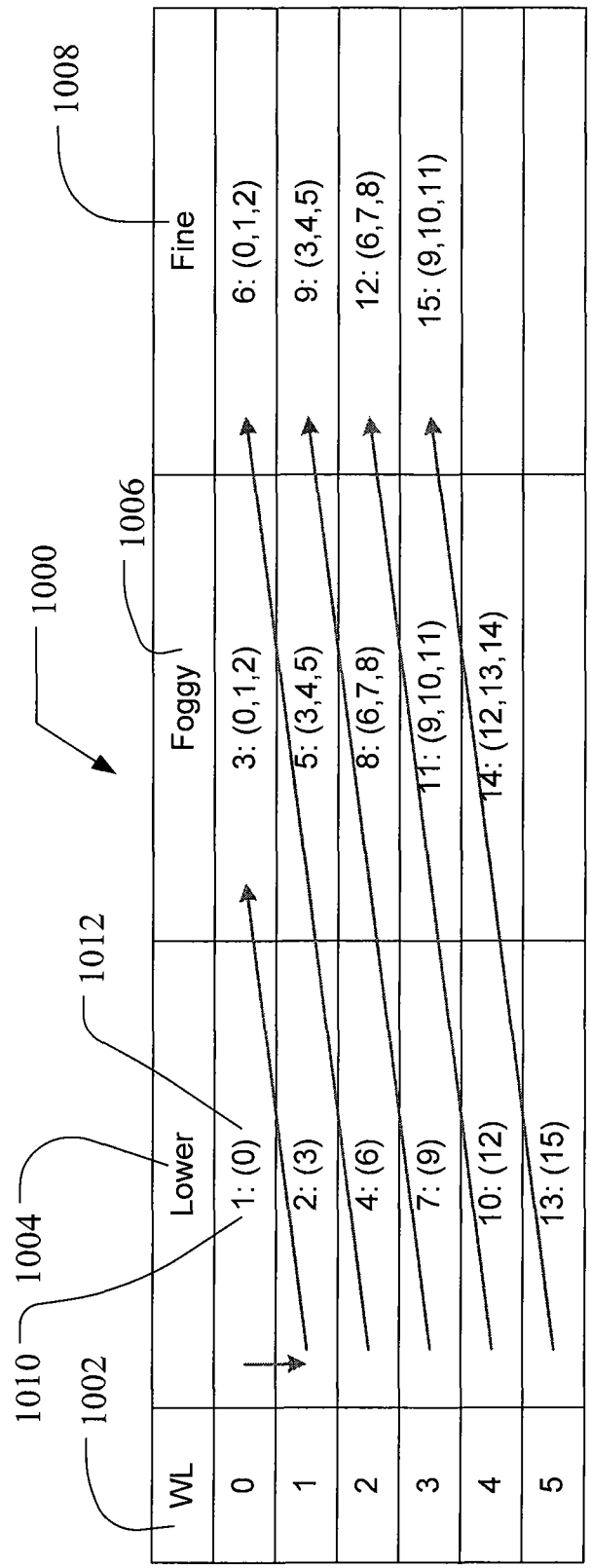
FIG. 10 illustrates a foggy-fine write process suitable for use in on-chip copy operations from binary metablocks to MLC metablocks.

The folding process begins with the first wordline (WL 0). In the table of FIG. 10, the write order 1010 precedes the pages written to 1012 under the type of write resolution pass for each wordline. For example, the sixth write operation is on the first wordline (WL 0) and is a fine write pass for pages 0-2. The order of writing is illustrated by the diagonal arrows that show how a different one of a lower, foggy or fine programming pass may be made sequentially on three sequential wordlines such that up to seven pages may need to be cached at any one time. This can be seen, for example in the concurrent writing to wordlines 2, 1 and 0, where the lower resolution write is made to page 6 on WL 2, a foggy resolution write is made to pages 3-5 on WL 1 and a fine resolution write is made to pages 0-2 on WL 0. The fine resolution write to WL 0 is the third and final pass for WL 0 so that the next round of writes begins on WL 3 and ends at WL 1, and so on as indicated in FIG. 10.

Although many more wordlines are contemplated and the number of pages per wordline may be greater than 3, for ease of illustration only five wordlines and 16 pages are shown in FIG. 10. In the example of FIG. 10, a maximum of 7 pages is included in a write pass and is maintained in binary memory rather than controller buffer RAM so that the VRAM size for the controller may be kept smaller and so that power loss issues can be avoided. The two die example of FIGS. 9A-9D is provided for simplicity of illustration. In other embodiments, different numbers of die and/or numbers of planes per die may be utilized.

Figure 11:
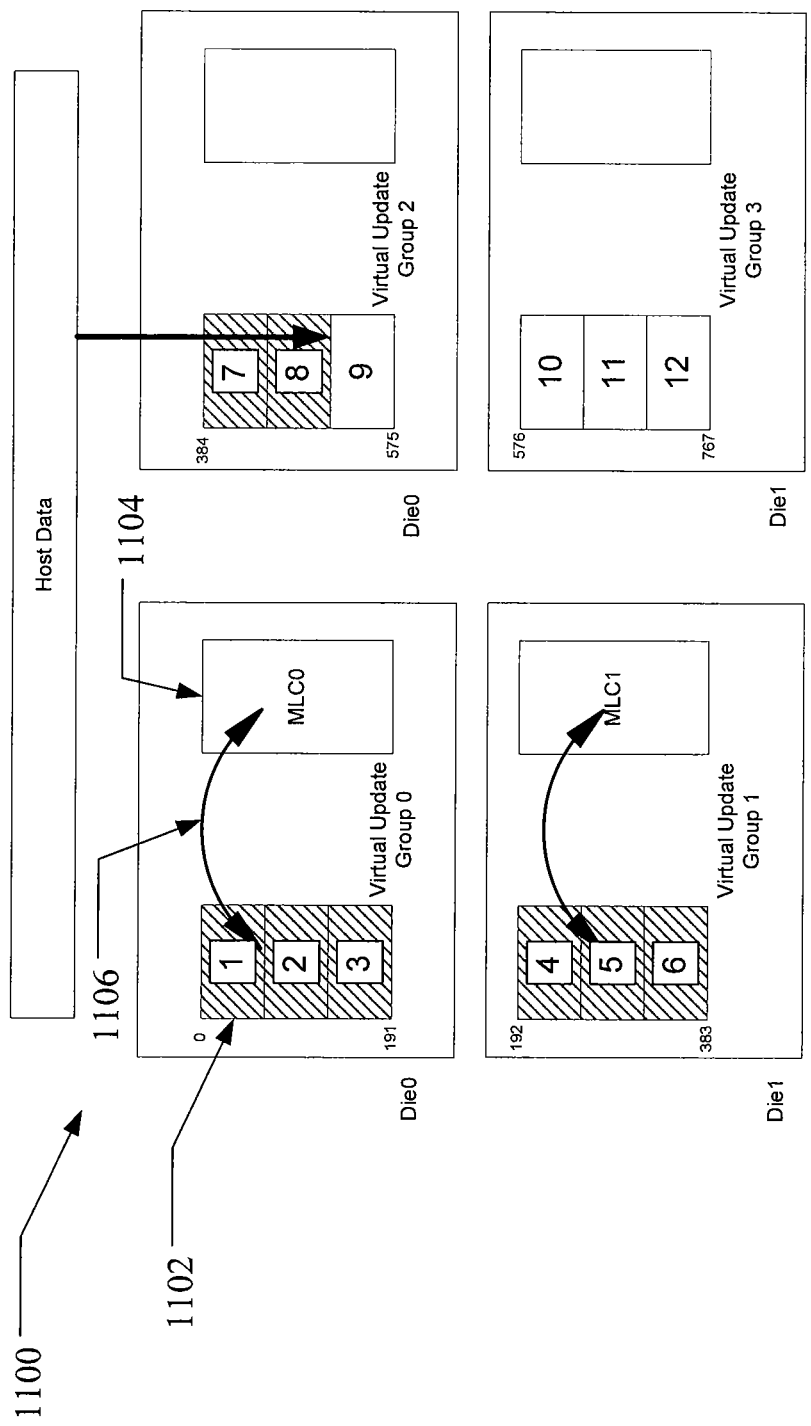
FIG. 11 is an alternative embodiment of the sequential write and parallel folding operations of FIGS. 9A-9D.

In the embodiment of FIG. 11, where a two die memory 1100 Die 0, Die 1 is shown having virtual update groups of three binary update blocks 1102 associated with each MLC block 1104 as in the example of FIG. 9, another method for metablock interleaving may include first filling up a virtual update group of three update blocks in each of the two die (Die 0 and Die 1), then folding 1106 the resulting six update blocks into their respective two MLC blocks simultaneously.

While folding the sequentially addressed data in each die from binary to MLC blocks, the next sequentially addressed data may be concurrently written into the binary update blocks in each of the Die 0 and Die 1. Once binary blocks D1-D6 are filled the folding process will begin folding data from D1-3 to MLC0 and D4-6 to MLC1. The host continues sequential writes to D1 blocks D7-9 and then D10-12 that are interspersed with the folding operations of Virtual Update Groups 0 and 1. As in the example of FIGS. 9A-9D, the number of pages written to the binary update blocks in the example of FIG. 11 should be equal to the number of pages folded. Every fold operation 1106 results in three metapages of data being transferred from binary to MLC. Therefore it is necessary for the host to write three metapages to binary for every fold operation. In this example, two folds are performed in parallel so a total of six metapages need to be written to the binary buffers for every pair of fold operations.

Figure 12:
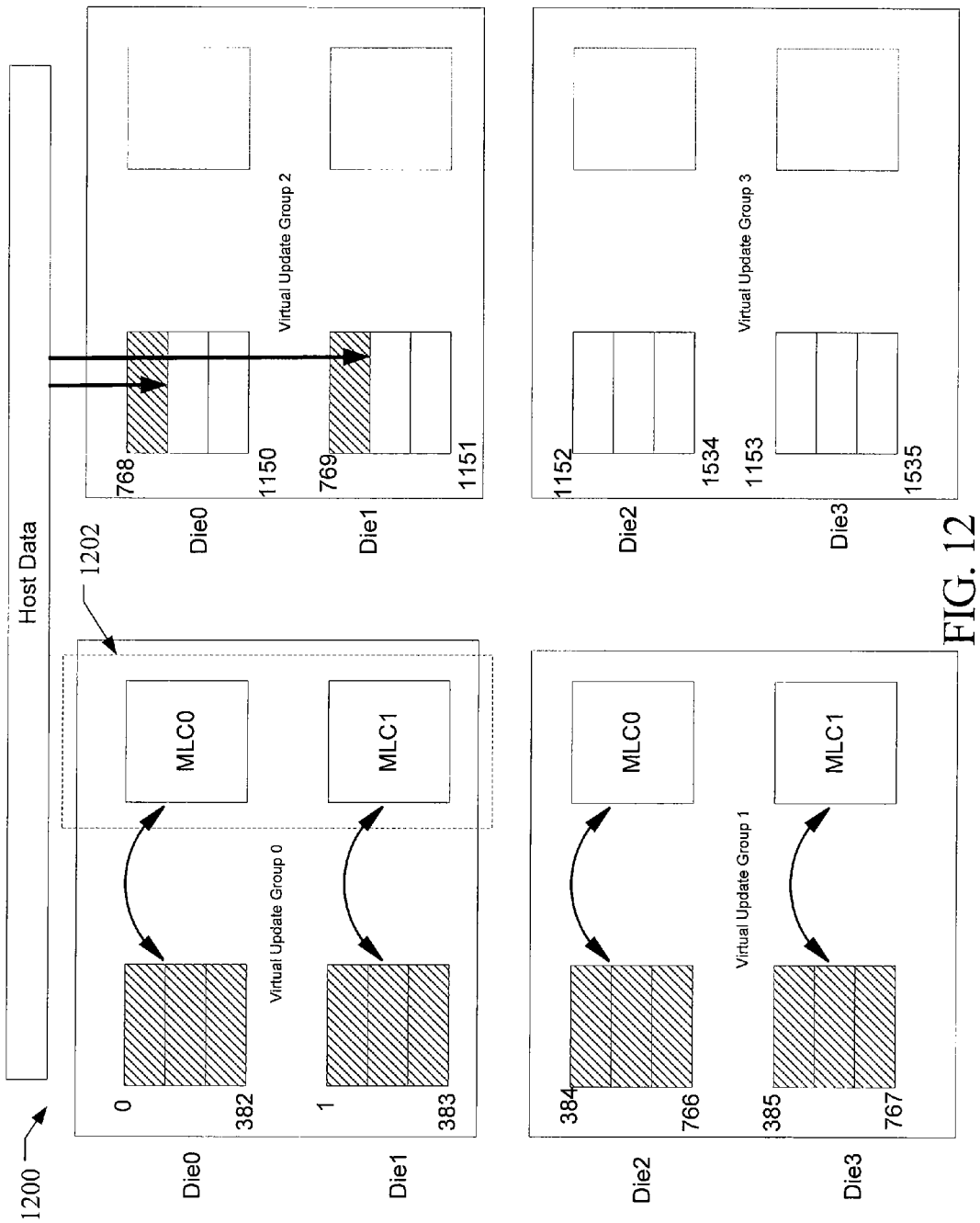
FIG. 12 is a second alternative embodiment of the sequential write and parallel folding operations of FIGS. 9A-9D.

In an embodiment illustrated in FIG. 12, a hybrid combination of page level interleaving and metablock level interleaving is also contemplated. For example, in a 4-die memory 1200 (Die 0-Die 3) data may be interleaved across 4 MLC planes in two die to create a 6 MB metablock 1202, and then the two pairs of die (Die 0, Die 1 and Die 2, Die 3) may be block interleaved. This approach achieves a mix of sequential performance through 2-die interleaving but limits the metablock size to 6 Megabytes (MB) instead of 12 MB that would result from a full 4-die page level interleave. The order and timing of the host data write sequence to the page interleaved binary blocks of Die 0 and Die 1 and the subsequent folding operation from binary blocks to MLC blocks may be managed such that all 12 MB of binary update blocks in Virtual Update Group 0 and Virtual Update Group 1 are completed before simultaneously folding the binary blocks into their respective MLC blocks.

The above-described techniques of writing sequentially addressed data to binary blocks and then folding multiple binary blocks into MLC blocks in parallel may be implemented as part of an overall data flow in a memory system. The process and system discussed above is suitable for sequential writes to binary blocks and parallel folds into MLC blocks for data coming from multiple sources. For example, the data that triggers a fold operation may be received at the memory system from an external host. Alternatively, the trigger for a folding operation may be data previously received from the host and already in the memory system. The fold operation would then be triggered by a housekeeping function. Examples of housekeeping functions might be the eviction of data from a binary cache in the memory when enough non-sequential data runs have been collected to assemble a complete sequentially addresses virtual update block. Other housekeeping functions that might trigger a fold operation may be wear leveling operations that would result in a MLC-to-MLC block copy that would go through a virtual update block. Another example of a housekeeping operation capable of triggering a fold operation may be the process of cleaning up and closing binary blocks in a way that leads to the creation of a virtual update block. Thus the creation of virtual update blocks may be through sequentially written data received directly from an external source (e.g. host) or sources internal to the memory where previously received host data is moved about by housekeeping functions.

Figure 13:
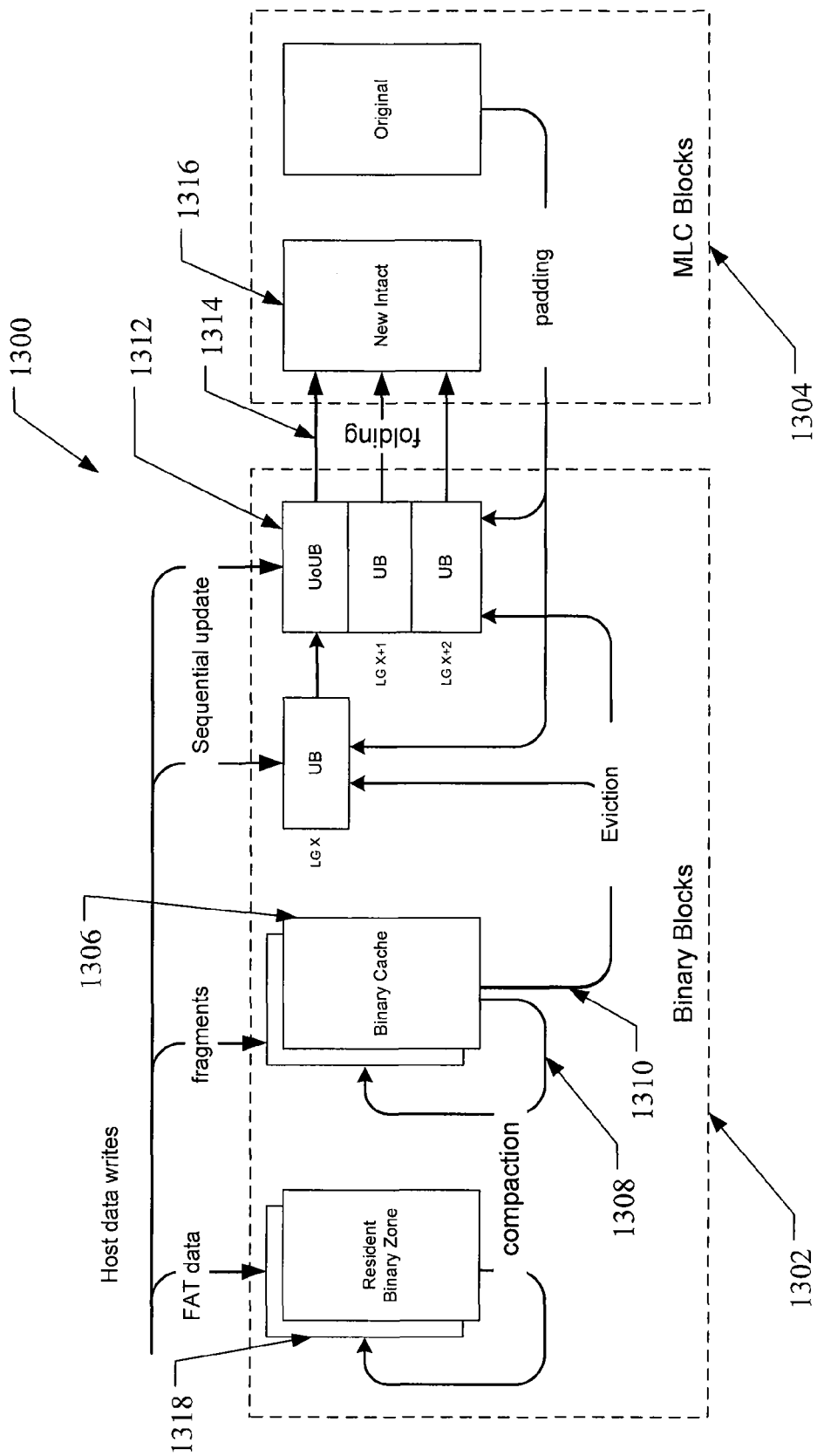
FIG. 13 is a memory system with a data flow suitable for incorporating the sequential write and parallel fold operations disclosed in FIGS. 9A-9D.

One example of a memory system 1300 with a data flow suitable for incorporating the above-described techniques is illustrated in FIG. 13. FIG. 13 also illustrates the various sources from which data may be received to form virtual update blocks 1312 in binary memory and trigger fold operations in MLC memory. The memory system 1300 includes binary blocks 1302 and MLC blocks 1304. A memory controller will route small fragments less than a metapage to the binary cache 1306. The binary cache 1306 will be periodically compacted 1308 to clean up stale data. When the binary cache 1306 fills up, a logical group will be selected for eviction 1310. The internal housekeeping function of binary cache eviction copies the logical group to a virtual update block 1312 and schedules it for folding 1314 to an MLC block 1316.

Host data writes with a length greater than a metapage will be written directly to virtual update blocks. Several virtual update blocks 1312 can be open at a time though only one virtual update block per die will be folding at a time. When the system 1300 has exhausted the virtual update block resources, a virtual update block 1312 will be selected and scheduled for folding. Once data is successfully folded from binary blocks 1302 to MLC blocks 1304, the virtual update block 1312 is retired and the binary block resources previously tied up with the virtual update block can be recovered. It should be noted that data that is written to binary cache may experience at least two binary writes before being folded to MLC blocks. It is written once to the binary cache 1306, compacted 1308 zero or more times within the binary cache, and finally evicted 1310 and written to a binary virtual update block to be scheduled for folding. Long sequential, aligned writes may experience only one binary write directly to a virtual update block before being folded to an MLC block.

FIG. 13. also illustrates the process of adding an update of update block (UoUB) to a virtual update block. An update of update block contains updated information that is already in a binary update block, but that has been partially updated again prior to the original update block being folded into an MLC block. Thus the valid sequentially addressed data for a particular host address range may be found in two separate update blocks and an MLC block that is then copied into a virtual update block for folding into a new MLC block.

A special host resident binary cache zone 1318 can be reserved for File Allocation Table (FAT) areas or other logical regions that require frequent updates or faster write performance. MLC blocks will only be written by the operation of folding, or copying of the entire logical group from single, fully written, closed virtual update block. In other words, a logical group has to be fully consolidated to virtual update blocks 1312 before folding to an MLC metablock. The logical group needs to be consolidated together into the last Virtual Update block with an error correction code (ECC) check upon read from flash sources and ECC correction if necessary. In addition, some data, like FAT table data, can be routed to the host resident binary cache zone 1318 and stay resident there, thus not triggering any logical group consolidations.

A system and method has been described for achieving memory die parallelism by interleaving sequentially written data at a block level. Binary (or SLC) blocks may be programmed serially in sequential page order; an integral number of binary blocks are then folded into an MLC block in parallel. By interleaving sequentially written data across blocks, the same page order may be preserved, for any integral interleave factor. Accordingly, the number of memory die that can be operated in parallel does not increase the metablock size. Also, a combination of page interleaving and metablock interleaving may be implemented in a multiple die memory to obtain improved sequential write performance and reduce metablock size. The entirety of the following concurrently filed (Dec. 18, 2009), commonly owned U.S. patent application is incorporated herein by reference: "DATA TRANSFER FLOWS FOR ON-CHIP FOLDING", U.S. application Ser. No. 12/642,649.

It is intended that the foregoing detailed description be understood as an illustration of selected forms that the invention can take and not as a definition of the invention. It is only the following claims, including all equivalents, that are intended to define the scope of this invention. Also, some of the following claims may state that a component is operative to perform a certain function or configured for a certain task. It should be noted that these are not restrictive limitations. It should also be noted that the acts recited in the claims can be performed in any order and not necessarily in the order in which they are recited.

What is claimed is:

1. A non-volatile memory system comprising:
a non-volatile memory comprising a first non-volatile memory die and a second non-volatile memory die, wherein each of the first and second non-volatile memory dies has a single-level cell (SLC) cache storage area and a main storage area, wherein a block in the main storage area is configured to store a first amount of data, wherein a block in the SLC cache storage area is configured to store a second amount of data, and wherein the first amount is different than the second amount; and
a controller configured to:
receive data, the received data associated with host logical block addresses;
segment writing of sequentially addressed data across the first and second memory dies such that a first section of sequentially addressed data equal to the first amount of data is stored to the SLC cache storage area of the first non-volatile memory die and a second section of sequentially addressed data equal to the first amount of data is stored to the SLC cache storage area of the second non-volatile memory die; and
write at least a part of the first section from the SLC cache storage area to the main storage area of the first non-volatile memory die while writing at least a part of the second section to the SLC cache storage area of the second non-volatile memory die,
wherein the second section is sequential to the first section in the sequentially addressed data.

2. The non-volatile memory system of claim 1, wherein the controller is further configured to write data from the SLC cache storage area to the main storage area of the first non-volatile memory die while writing data from the SLC cache storage area to the main storage area of the second non-volatile memory die.

3. The non-volatile memory system of claim 1, wherein the SLC cache storage area of each of the first and second non-volatile memory dies comprises SLC flash memory and the main storage area of each of the plurality of dies comprises multi-level cell (MLC) memory.

4. The non-volatile memory system of claim 3, wherein for each of the first and second non-volatile memory dies, the first amount of data stored in a block of MLC memory in the main storage area is greater than the second amount of data stored in a block of SLC memory in the SLC cache storage area.

5. The non-volatile memory system of claim 4, wherein the first amount of the data stored in the block of MLC memory in the memory storage area is an integer multiple of the second amount of the data stored in the block of SLC memory in the SLC cache storage area.

6. The non-volatile memory system of claim 1, wherein the at least a part of the first section written from the SLC cache storage area to the main storage area of the first non-volatile memory die is maintained in a same sequentially addressed order such that the block of the main storage area contains sequentially addressed pages of the data written from the SLC cache storage area.

7. The non-volatile memory system of claim 1, wherein the first and second non-volatile memory dies each comprise at least two planes, wherein each of the first and second non-volatile memory dies has an SLC cache storage area and a main storage area for each of the at least two planes; and
wherein the controller is further configured to:
write sequentially addressed data to the SLC cache storage area of a first plane of the first non-volatile memory die;
after writing an amount of sequentially addressed data to the SLC cache storage area of the first plane of the first non-volatile memory die equal to a block of the main storage area of the first plane, write additional received sequentially addressed data to an SLC cache storage area of a next plane of the first non-volatile memory die until a second amount of sequentially addressed data is written into the SLC cache storage area of the next plane equal to a block of the main storage area of the next plane; and
after writing to each of the at least two planes of the first non-volatile memory die, write respective additional sequentially addressed data received from the host to an SLC cache storage area, and then from the SLC cache storage area to a main storage area, for each respective plane of the second non-volatile memory die.

8. The non-volatile memory system of claim 1, wherein the controller is further configured to determine whether an amount equal to the block of the main storage of the first non-volatile memory die is stored to the SLC cache storage area of the first non-volatile memory die; and
wherein the controller is configured to write the at least a part of the first section from the SLC cache storage area to the main storage area of the first non-volatile memory die in response to determining that the amount equal to the block of the main storage of the first non-volatile memory die is stored to the SLC cache storage area of the first non-volatile memory die.

9. A method of operating a non-volatile memory system comprising:
in a non-volatile memory system having a controller and a nonvolatile memory comprising a first non-volatile memory die and a second non-volatile memory die, wherein each of the first and second non-volatile memory dies has a single-level cell (SLC) cache storage area and a main storage area, wherein a block in the main storage area is configured to store a first amount of data, wherein a block in the SLC cache storage area is configured to store a second amount of data, and wherein the first amount is different than the second amount:
the controller receiving data associated with host logical block addresses;
the controller segmenting writing of sequentially addressed data across the first and second memory dies such that a first section of sequentially addressed data equal to the first amount of data is stored to the SLC cache storage area of the first non-volatile memory die and a second section of sequentially addressed data equal to the first amount of data is stored to the SLC cache storage area of the second non-volatile memory die; and
the controller writing at least a part of the first section from the SLC cache storage area to the main storage area of the first non-volatile memory die while writing at least a part of the second section to the SLC cache storage area of the second non-volatile memory die, wherein the second section is sequential to the first section in the sequentially addressed data.

10. The method of claim 9, wherein receiving data comprises receiving data from an external host.

11. The method of claim 9, wherein receiving data comprises receiving data from a source internal to the memory system.

12. The method of claim 9, further comprising the controller writing data from the SLC cache storage area to the main storage area of the first non-volatile memory die while writing data from the SLC cache storage area to the main storage area of the second non-volatile memory die.

13. The method of claim 9, wherein writing sequentially addressed data to the SLC cache storage area comprises writing sequentially addressed data to SLC flash memory.

14. The method of claim 9, wherein writing data from the SLC cache storage area to the main storage area comprises writing data from SLC memory to multi-level cell (MLC) memory.

15. The method of claim 14, wherein for each of the first and second nonvolatile memory dies, the first amount of data stored in a block of MLC memory in the main storage area is greater than the second amount of data stored in a block of SLC memory in the SLC cache storage area.

16. The method of claim 15, wherein the first amount of the data stored in the block of MLC memory in the memory storage area is an integer multiple of the second amount of the data stored in the block of SLC memory in the SLC cache storage area.

17. The method of claim 9, wherein the at least a part of the first section written from the SLC cache storage area to the main storage area of the first non-volatile memory die is maintained in a same sequentially addressed order such that the block of the main storage area contains sequentially addressed pages of the data written from the SLC cache storage area.

18. The method of claim 9, wherein the first and second non-volatile memory dies each comprise at least two planes, and each of the first and second non-volatile memory dies has a SLC cache storage area and a main storage area for each of the at least two planes; and
the method further comprising:
the controller writing sequentially addressed data to the SLC cache storage area of a first plane of the first non-volatile memory die;
after writing an amount of sequentially addressed data to the SLC cache storage area of the first plane of the first non-volatile memory die equal to a block of the main storage area of the first plane, the controller writing additional received sequentially addressed data to an SLC cache storage area of a next plane of the first non-volatile memory die until a second amount of sequentially addressed data is written into the SLC cache storage area of the next plane equal to a block of the main storage area of the next plane; and
after writing to each of the at least two planes of the first non-volatile memory die, the controller, for each plane in a next die, writing respective additional sequentially addressed data received from the host to an SLC cache storage area, and then from the SLC cache storage area to a main storage area, for each respective plane of the second non-volatile memory die.

19. The method of claim 9, further comprising the controller determining whether an amount equal to the block of the main storage of the first non-volatile memory die is stored to the SLC cache storage area of the first non-volatile memory die; and
wherein the controller writing the at least a part of the first section from the SLC cache storage area to the main storage area of the first non-volatile memory die is in response to the controller determining that the amount equal to the block of the main storage of the first non-volatile memory die is stored to the SLC cache storage area of the first non-volatile memory die.

20. A non-volatile memory system comprising:
a non-volatile memory comprising a first non-volatile memory die and a second non-volatile memory die, wherein each of the first and second non-volatile memory dies has a single-level cell (SLC) cache storage area and a main storage area, wherein a block in the main storage area is configured to store a first amount of data, wherein a block in the SLC cache storage area is configured to store a second amount of data, and wherein the first amount is different than the second amount; and
a controller configured to:
receive data, the received data associated with host logical block addresses;
segment writing of sequentially addressed data across the first and second memory dies such that a first section of sequentially addressed data equal to an integer number of the first amount is stored to the SLC cache storage area of the first non-volatile memory die and a second section of sequentially addressed data equal to an integer number of the first amount is stored to the SLC cache storage area of the second non-volatile memory die; and
write at least a part of the first section from the SLC cache storage area to the main storage area of the first non-volatile memory die while writing at least a part of the second section to the SLC cache storage area of the second non-volatile memory die,
wherein the second section is sequential to the first section in the sequentially addressed data.

21. The non-volatile memory system of claim 20, wherein the controller is further configured to write data from the SLC cache storage area to the main storage area of the first non-volatile memory die while writing data from the SLC cache storage area to the main storage area of the second non-volatile memory die.

22. The non-volatile memory system of claim 20, wherein the controller is configured to receive data from a host external to the memory system, and
wherein the controller is configured to write sequentially addressed data to the SLC cache storage area and write data from the SLC cache storage area to the main storage area of the first non-volatile memory die in response to receiving data from the host.

23. The non-volatile memory system of claim 20, wherein the controller is configured to receive data from a source internal to the memory system as a result of a housekeeping operation, and
wherein the controller is configured to write sequentially addressed data to the SLC cache storage area and write data from the SLC cache storage area to the main storage area of the first non-volatile memory die in response to receiving data from the source internal to the memory system.

24. The non-volatile memory system of claim 20, wherein the controller is further configured to determine whether an amount equal to the integer number of the first amount is stored to the SLC cache storage area of the first non-volatile memory die; and wherein the controller is configured to write the at least a part of the first section from the SLC cache storage area to the main storage area of the first non-volatile memory die in response to determining that the amount equal to the integer number of the first amount is stored to the SLC cache storage area of the first non-volatile memory die.

* * * * *